United States Patent
Biber et al.

(10) Patent No.: US 9,297,868 B2
(45) Date of Patent: Mar. 29, 2016

(54) ANTENNA CIRCUIT FOR AN MRI SYSTEM

(75) Inventors: Stephan Biber, Erlangen (DE); Jürgen Nistler, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1141 days.

(21) Appl. No.: 13/277,006

(22) Filed: Oct. 19, 2011

(65) Prior Publication Data

US 2012/0098540 A1 Apr. 26, 2012

(30) Foreign Application Priority Data

Oct. 19, 2010 (DE) .......................... 10 2010 042 633

(51) Int. Cl.
*G01R 33/34* (2006.01)
*G01R 33/36* (2006.01)
*G01R 33/3415* (2006.01)

(52) U.S. Cl.
CPC ........ *G01R 33/3607* (2013.01); *G01R 33/3621* (2013.01); *G01R 33/3415* (2013.01)

(58) Field of Classification Search
CPC ........... G01R 33/3415; G01R 33/3621; G01R 33/34076
USPC ........................... 324/300–322; 600/407–422
See application file for complete search history.

(56) References Cited

U.S. PATENT DOCUMENTS

| | | | |
|---|---|---|---|
| 6,351,124 B1 * | 2/2002 | Vester et al. | 324/318 |
| 7,123,012 B2 * | 10/2006 | Srinivasan | 324/318 |
| 7,573,036 B2 | 8/2009 | Vester | |
| 2004/0231137 A1 * | 11/2004 | Seeber | 29/601 |
| 2004/0257079 A1 * | 12/2004 | Dumoulin et al. | 324/318 |
| 2007/0114423 A1 | 5/2007 | Vester | |
| 2007/0279058 A1 | 12/2007 | Bulkes et al. | |
| 2008/0227416 A1 | 9/2008 | Nistler et al. | |
| 2008/0297155 A1 | 12/2008 | Kroeckel | |
| 2010/0213939 A1 | 8/2010 | Sodickson et al. | |
| 2011/0121833 A1 * | 5/2011 | Sambandamurthy et al. | 324/318 |
| 2011/0187371 A1 * | 8/2011 | Takegoshi et al. | 324/322 |

FOREIGN PATENT DOCUMENTS

| | | |
|---|---|---|
| CN | 1971652 A | 5/2007 |
| DE | 10 2007 024 824 B3 | 2/2009 |
| DE | 102007012052 B4 | 6/2010 |
| WO | 2007100696 A2 | 9/2007 |

OTHER PUBLICATIONS

German Office Action dated Jun. 29, 2011 for corresponding German Patent Application No. DE 10 2010 042 633.4 with English translation.
Chinese Office Action in Chinese Patent Application No. 2011103175396, dated Sep. 1, 2014, with English translation.

* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

The present embodiments include an antenna circuit that is adapted to supply and/or read out a plurality of antenna elements of an antenna assembly of a magnetic resonance imaging system. The antenna elements are decoupled by phase shifter elements and supplied with signals by the phase shifter elements. The antenna circuit may also be used to detect signals that are received by the antenna elements.

17 Claims, 5 Drawing Sheets

ANTENNA CIRCUIT FOR AN MRI SYSTEM

This application claims the benefit of DE 10 2010 042 633.4, filed on Oct. 19, 2010.

BACKGROUND

The present embodiments relate to an improved antenna circuit for a magnetic resonance imaging (MRI) system that controls an antenna assembly or reads-in signals of the antenna assembly.

MRI systems from the prior art include a single transmitter that is provided to generate a substantially homogeneous high frequency field for applying magnetic resonance. The associated transmitting antenna (e.g., a Body Coil (BC)) is permanently installed in a magnet and in gradient coils. To receive magnetic resonance signals, a multichannel assembly of receiving antenna (e.g., local coils) closely applied to the patient is used by contrast. The antennae that are not used in each case may be switched off or de-tuned by a PIN diode switch.

Applying the local coils to the object to be examined (e.g., to the patient) and forwarding the receiving signals to the patient couch is undesirable due to the complicated cable routing. A permanently installed receiving antenna assembly including very low-noise antenna elements using a "Remote Body Array" has, therefore, been proposed. A remote body array is described by way of example in US 2010/0213939 A1. A radial installation space for a cylindrical "Remote Body Array" (RBA) is radially inwardly limited because an optimally large patient opening is desirable. Larger diameters of the magnet or gradient systems lead to greatly increasing costs. The receiving elements of the RBA are therefore to be placed close to the transmitting antenna (BC). This results in a strong magnetic coupling between the transmitting coil (BC) and the RBA, whereby the requirements made on the de-tuning switch in the transmitting antenna (BC) (e.g., on the reduction of losses) are increased. Eddy currents may form on conductor structures of the transmitting antenna (BC). The eddy currents generate loss resistances even without participation of the switch and thereby couple noise into the receivers of the RBA. These losses are a problem because the requirements on the quality of all RBA elements are significantly higher, owing to the large spacing from the patient, than with local coils applied to the patient.

It has been proposed that the transmitting antenna be dispensed with, and the receiving elements of the RBA also be used for transmission. This solution has the advantage that the RBA may be made thicker and therefore more efficient since the additional space for the transmitting antenna (BC) may be omitted. Each antenna element receives a transceiver switch. Since this changeover switch does not have to be located in a high-quality resonance current circuit, but may be arranged after the transformation (e.g., at an impedance of 50 Ohm), a loss contribution of the changeover switch is no higher than is the case with conventional antenna designs. Receiving branches of the switches are forwarded to one receiver per element.

FIG. 11 shows an assembly from the prior art. An antenna element 102 is connected to a transceiver switch 104. An output of the transceiver switch 104 is connected to an input of an amplifier 110. The input of the transceiver switch 104 is connected to a distribution network, to which a plurality of antennae 102 are connected by corresponding transceiver switches 104. An output of a transmitting amplifier 108 is connected to an input of the distribution network 106.

Known solutions to this distribution are cascades including power splitters and phase shifters (e.g., Wilkinson splitters and Butler matrix) that may be inserted in lines with an impedance of 50 Ohm.

Such supply networks have a well-defined output impedance (e.g., 50 Ohm), with which each of the antennae is supplied. Each antenna may be optimally adapted to this resistance with respect to power. Different load resistances may occur at the individual antennae 102, however, due to different patient sizes and patient positions. A significant mutual coupling of the antennae 102 is to be anticipated. Even with a distribution of the waves converging on the antennae that is homogenous per se, very uneven current distributions may form. The uneven current distributions may lead to an inhomogeneous distribution of a spin-excitation and a patient power loss (SAR). This problem does not occur with the conventional high-pass or low-pass birdcage antenna assemblies used for transmission, since the resonance frequencies of the higher spatial frequency modes are very distant. The elements of a transceiver assembly are to be decoupled from each other to achieve the functionality of the assembly, so different current distributions may form.

There is therefore a requirement for a distribution network that, when transmitting signals using an antenna assembly, enforces a fixed and load-independent relationship of the currents in the antenna elements with respect to each other.

An equal current may be attained in a plurality of coils, for example, by a series connection. Even if each coil is to be supplemented by a capacitor to form a series resonance circuit, the resonance circuits may be connected in series. However, with high frequencies, a series connection may not be practicable owing to the distributed capacitors in the connecting lines.

SUMMARY AND DESCRIPTION

The present embodiments may obviate one or more of the drawbacks or limitations in the related art. For example, an optimally fixed and load-independent relationship of currents in antenna elements when transmitting signals using an antenna assembly is provided.

In one embodiment, an antenna circuit that is adapted to supply and read out a plurality of antenna elements of an antenna assembly of a magnetic resonance imaging system is provided. The antenna circuit includes a first circuit connector that is adapted to be connected to a first receiving and/or transmitting circuit. The antenna circuit includes a first antenna-side connector that is adapted to be connected to a first antenna element of the antenna assembly, and a second antenna-side connector that is adapted to be connected to a second antenna element of the antenna assembly. The antennae circuit includes a first phase shifter element and a second phase shifter element that cause a phase shift of the signal of 90° or 270° and each has a predetermined admittance. A first connector of the first phase shifter element and a first connector of the second phase shifter element are connected to the first circuit connector. A second connector of the first phase shifter element is connected to a first antenna-side connector, and a second connector of the second phase shifter element is connected to a second antenna-side connector. If a fixed voltage is applied to the first circuit connector, a load-independent current results in the first antenna element and the second antenna element owing to the phase shift of the current by 90° or 270° each according to load type. A ratio of the currents may be fixed by the selection of the admittance of the phase shifter element.

In another embodiment, an antenna circuit that is adapted to supply and/or read out a plurality of antenna elements of an antenna assembly of a magnetic resonance imaging system is provided. The antenna circuit includes a first circuit connector that is adapted to be connected to a first receiving and/or transmitting circuit, and a second circuit connector that is adapted to be connected to a second receiving and/or transmitting circuit. The antenna circuit also includes a first antenna-side connector that is adapted to be connected to a first antenna element of the antenna assembly. The antenna circuit includes a first phase shifter element and a second phase shifter element that each cause a phase shift of the signal of 90° or 270° and each have a predetermined admittance. A first connector of the first phase shifter element is connected to the first circuit connector, and a first connector of the second phase shifter element is connected to the second circuit connector. A second connector of the first phase shifter element is connected to the first antenna-side connector, and a second connector of the second phase shifter element is connected to the first antenna-side connector. With this antenna circuit, current in the antenna element, which is connected to the antenna-side connector, is fixed by the sum of voltages at the circuit connectors multiplied by the admittance of the respective phase shifter element.

The phase shifter element may be a two-port network. With the phase shift of 90° or 270°, the signal values (e.g., the current and/or voltage) are phase-shifted from the input of the two-port network with respect to the output of the two-port network by 90° or 270°. The phase shifter element may cause a delay that corresponds to a phase shift of 90° or 270°. The phase shifter element may be constructed as a delay line. The two-port network may have four connections. Two connections may be signal connections, and two connections may be ground connections.

The phase between current and voltage results from a load on the phase shifter element. The phase shift between current and voltage is 0° for absorptive load and about 90° for reactive load. These properties are not changed by the phase shifter element. The phase shifter element generates the phase shift between the incoming wave at the input and the outgoing wave at the output of the two-port network (e.g., the "delay").

The antenna circuit may be adapted to supply and/or read out an antenna assembly that is radially arranged between the at least one magnet and the at least one gradient coil and the object to be examined (e.g., the patient). The antenna assembly may be constructed as a birdcage antenna. The antenna assembly may be, for example, cylindrical in design and arranged between the magnet and the patient.

The antenna circuit may include a third phase shifter element that causes a phase shift of the signal of 90° or 270° and has a predetermined admittance, with the first connector of the third phase shifter element being connected to the first circuit connector and the second connector of the third phase shifter element being connected to a third antenna-side connector. The antenna circuit forms a distribution network that connects two inputs to three antennae.

The first connector of the third phase shifter element may be connected to the second circuit connector, and the second connector of the third phase shifter element may be connected to the first antenna-side connector. With this antenna circuit, a signal may be distributed among a plurality of antenna elements, and a plurality of signals at the circuit connectors may be connected to one antenna element. This is desirable, for example, if a circular field is to be generated.

The antenna circuit may include a first number K of circuit connectors that are adapted to be connected to a receiving and/or transmitting circuit. The antenna circuit may also include a second number L of antenna connections that are each adapted to be connected to an antenna element. The first number K of circuit connectors may be connected to different receiving and/or transmitting circuits, or at least some circuit connectors may be connected to connectors of the same receiving and/or transmitting circuits. In one embodiment, the second number L is greater than the first number K. Each antenna-side connector is connected to at least one circuit connector by a phase shifter element that causes a phase shift of the signal of 90° or 270° and has a predetermined admittance. At least one of the antenna-side connectors may be connected by two phase shifter elements to a circuit connector. This produces a distribution network that may couple the antenna elements of an antenna assembly to each other but may control with different currents.

At least two phase shifter elements may have different admittances. This embodiment may be used for generating a circular field.

The antenna circuit may include two circuit connectors, a signal, in which the current and the voltage are in phase, being connected to the first circuit connector. A signal, in which the current and/or voltage is/are phase shifted by 90° with respect to the signal applied to the first circuit connector, is connected to the second circuit connector. The phase shift may be generated using a 90° hybrid device. This antenna circuit is also operable to generate a circular polarization. The antenna may be a birdcage antenna.

The antenna circuit may include three antenna-side connectors that are connected to three antenna elements of the antenna (e.g., the birdcage antenna).

A phase shifter device, which may compensate any phase difference, may be connected to at least one antenna-side connector. A phase shift (e.g., owing to a delay) in a transceiver switch, a feed line, or an interface, for example, may be compensated by the phase shifter device.

A first antenna-side connector may be adapted so the first antenna-side connector may be connected to an antenna or an antenna element that forms a first parallel resonance circuit. A second antenna-side connector may be adapted to be connected to an antenna or an antenna element that forms the at least one series resonance circuit. This produces a phase shift between the voltage and the current of almost 90°, whereby a quarter wave line is formed. Identical currents may also be enforced by direct parallel connection of two parallel resonance circuits. In order to also add up the currents from a plurality of inputs with adjustable weighting, the phase shift of the resonant circuit wiring is to be reversed using the phase shifter device, so the parallel circuit is transformed back into a series circuit.

A phase shifter element that causes a phase shift of 90° and has a characteristic impedance $Z_o$ transforms a connected impedance Z into a reciprocal value $Z_o^2/Z$. This is equivalent to converting a connected two-port network into a dual network. By way of example, a parallel circuit (e.g., an R-L-C parallel connection) is converted into a series circuit (e.g., an R'-L-C series connection).

An antenna-side connector is connected by a plurality of serially connected phase shifter elements to at least one circuit connector, the phase shifter elements each causing a phase shift of the signal of 90° or 270° and each including a predetermined admittance.

A multi-stage distribution network may thus be created. Birdcage antennae, for example, that include a plurality of antennae in the axial direction, may be controlled using the distribution network. The antenna circuit provides that the antenna elements are decoupled from each other and receive a predefined current or a predefined voltage.

The antenna circuit may include a plurality of circuit connectors, a plurality of antenna-side connectors, and a plurality of phase shifter elements that are each connected between the circuit connector and the antenna-side connector. Each of the phase shifter elements may be formed by a capacitor. An inductor may be connected to each circuit connector. An inductor may be connected to each antenna-side connector. The inductors and the capacitors are dimensioned such that a phase shift of 90° or 270° of the signal results between a circuit connector and an antenna-side connector. The phase shifter element may be represented by a Π-circuit that is a two-port network, the connectors of the two-port network being connected by a capacitor and the connectors of the two-port network each being connected to ground by a coil. The size of the inductor at the circuit connector or at the antenna-side connector is determined by the inductors of the substitute circuit that are connected in parallel and are connected to the respective connector of the antenna circuit.

The antenna circuit may include first, second, third and fourth circuit connectors, a plurality of antenna-side connectors and a plurality of phase shifter elements that are each connected between a circuit connector and an antenna-side connector. The phase shifter elements may be formed by a capacitor. A first balun may be connected to the first and second circuit connectors, and a second balun may be connected to the third and fourth circuit connectors. An inductor may be connected to each antenna-side connector. The first balun, the second balun, inductors and capacitors are dimensioned such that a phase shift of the signal of 90° or 270° results between a circuit connector and an antenna-side connector.

The antenna circuit may be constructed simply as a result.

An input of a receiving amplifier may be connected to a circuit connector of the antenna circuit.

The present embodiments also relate to an antenna assembly including the above-described antenna circuit. The antenna assembly may, for example, be a birdcage antenna.

DETAILED DESCRIPTION OF THE DRAWINGS

Figure 1:
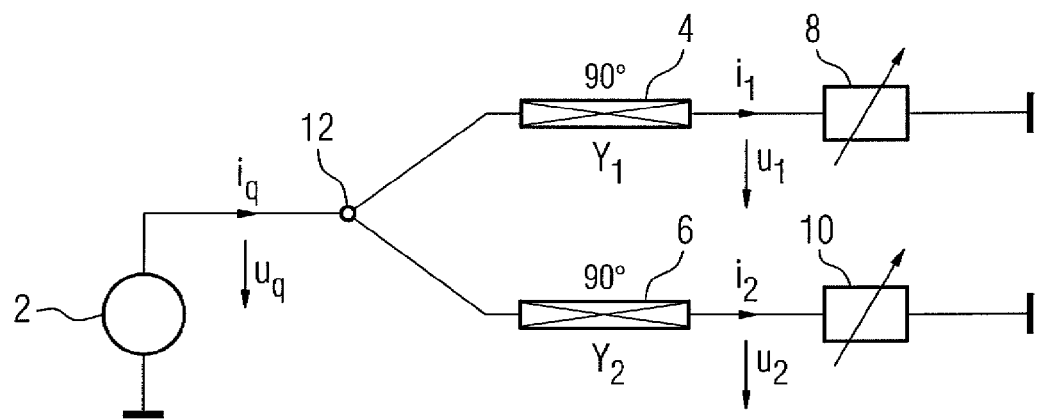
FIG. 1 shows a first embodiment of an antenna circuit.

FIG. 1 shows a first example circuit of an antenna circuit according to the present embodiments. A voltage source 2, which provides a voltage $u_q$ (e.g., a load independent voltage) and a current $i_q$, is connected to a circuit connector 12. A first phase shifter element 4 and a second phase shifter element 6 (e.g., phase shifter elements) are connected to the circuit connector 12. The first phase shifter element 4 and the second phase shifter element 6 produce a phase shift of a signal (e.g., of the voltage $u_q$ and the current $i_q$) of 90°. The first phase shifter element 4 is connected to a first antenna element 8, and the second phase shifter element 6 is connected to a second antenna element 10.

The first antenna element 8 and the second antenna element 10 (e.g., antenna elements) may each form a series resonance circuit. The antenna elements 8, 10 are each connected by a phase shifter element 4, 6, which may be constructed as a quarter wave line with a phase shift of 90° or 270°, to a common node. The following applies:

$$i_1 = jY_1 u_q;$$

$$i_2 = jY_2 u_q.$$

The load-independent voltage $u_q$ at the circuit connector 12 is transformed into a load-independent current $i_1$ or $i_2$ at an end of each of the phase shifter elements 4, 6 or each quarter wave line in the process. The selection of different line admittances Y may adjust any fixed transformation ratio. If a transmitter (e.g., the voltage source 2) with a very low internal resistance is connected to the circuit connector 12 (e.g., a branching node), all currents at the antenna elements (coils) connected to an output are permanently load-independent. However, even if a source with finite impedance is connected to the circuit connector 12, owing to the common voltage applied to the circuit connector 12, at least a ratio of the currents at the output is permanently load-independent. A change in voltage at the outputs (e.g., antenna elements) caused by a change in load or inductive coupling appears owing to:

$$i_q = jY_1 u_1 + jY_2 u_2$$

as a change in current at the circuit connector 12 and leads to the voltage $u_q$ being reduced. This change affects all antenna elements, however. Consequently, a vector of element currents is scaled by the above-mentioned load by only one factor, and this may be compensated by an adjustment of the power of the transmitter.

Figure 2:
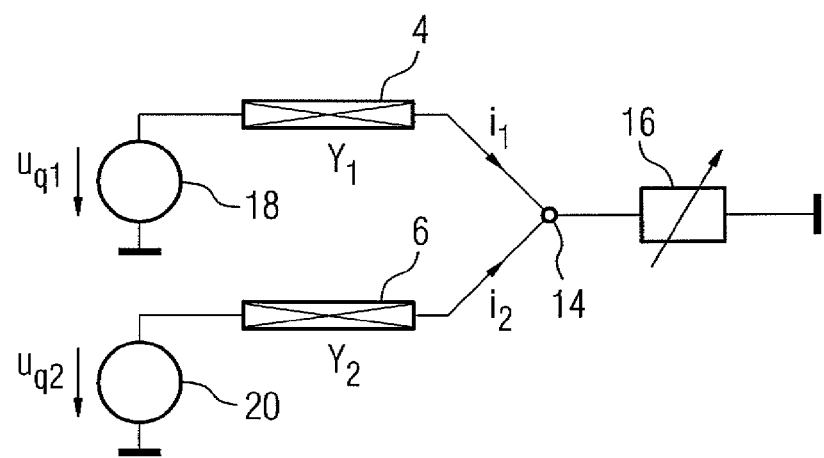
FIG. 2 shows a second embodiment of the antenna circuit.

FIG. 2 shows a second example circuit of the antenna circuit according to the present embodiments, which is based on a summation of currents from a plurality of inputs. A first current source 18 supplies a first voltage $u_1$ into the first phase shifter 4, which supplies a current $i_1$ into an antenna-side connector 14. A second current source 20 supplies a voltage $u_{q2}$ to the second phase shifter element 6, which supplies a current $i_2$ to the antenna-side connector 14. The sum of the currents $i_1$ and $i_2$ are supplied into an antenna element 16. This results in a distribution network with a plurality of inputs. The fact that outputs of the phase shifter elements 4, 6 or the quarter wave lines constitute virtual current sources that may be added by parallel connection without an effect on current ratios resulting from each input, is made use of here.

Figure 3:
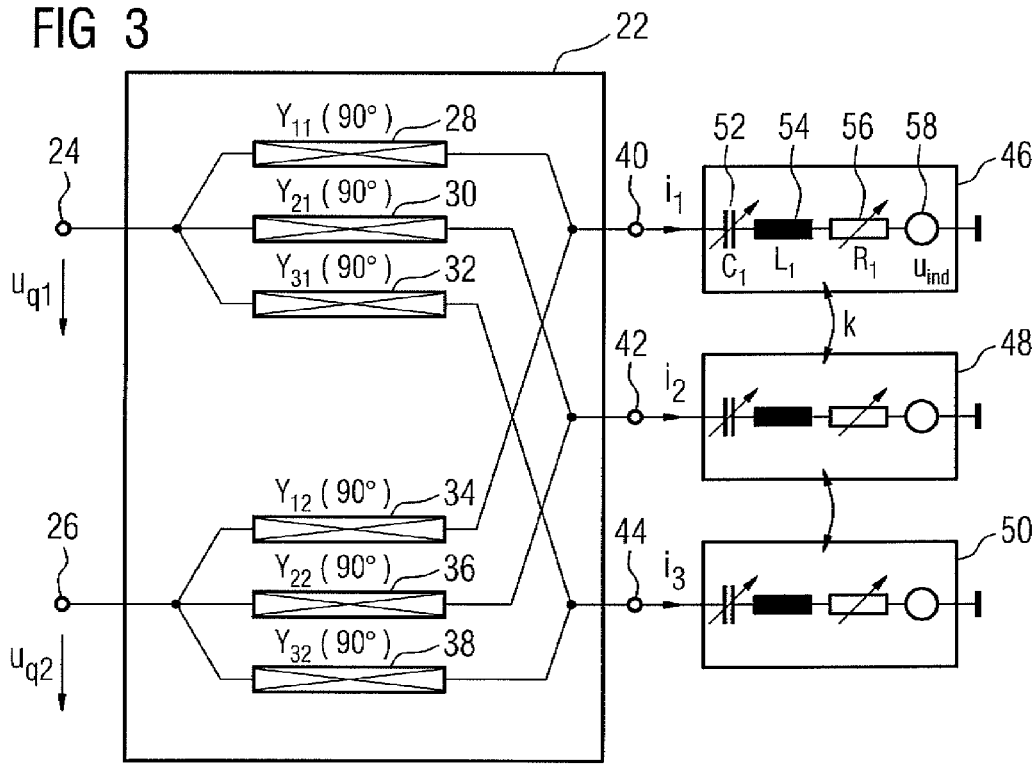
FIG. 3 shows a first embodiment of a distribution network.

FIG. 3 shows an embodiment of the antenna circuit as a distribution network 22 with two inputs or circuit-side connectors 24, 26 (e.g., a first circuit-side connector and a second circuit-side connector) and three outputs or antenna-side connectors 40, 42, 44 (e.g., a first antenna-side connector, a second antenna-side connector, and a third antenna-side connector). An antenna element 46, 48, 50 (e.g., a first antenna element, a second antenna element, or a third antenna element) is connected to each of the outputs. The antenna element 46, 48, 50 includes, in an equivalent circuit diagram, a series connection including a capacitor, an inductor, a resistor and an induced voltage. A voltage $u_{q1}$ is connected to the first input 24, and a voltage $u_{q2}$ is connected to the second input 26. The distribution network 22 includes a plurality of phase shifter elements 28, 30, 32, 34, 36, 38 (e.g., a first phase shifter element, a second phase shifter element, a third phase shifter element, a fourth phase shifter element, a fifth phase shifter element, and a sixth phase shifter element). The first phase shifter element 28 connects the first input 24 to the first output 40. The second phase shifter element 30 connects the first input 24 to the second output 42, and the third phase shifter element 32 connects the first input to the third output 44. The second input 26 is connected by the fourth phase shifter element 34 to the first output 40. The second input 26 is connected by the fifth phase shifter element 36 to the second output 42, and by a sixth phase shifter element 38 to the third output 44. The two inputs 24, 26 form circuit connectors, and the three outputs 40, 42, 44 form antenna-side connectors.

The equations for output currents $i_1$, $i_2$ and $i_3$ are:

$$i_1 = jY_{11}u_{q1} + jY_{12}u_{q2};$$

$$i_2 = jY_{21}u_{q1} + jY_{22}u_{q2};$$

$$i_3 = jY_{31}u_{q1} + jY_{32}u_{q2}.$$

The phase shifter elements 28, 30, 32, 34, 36, 38 may provide a phase shift of 90° or 270° C. and may be constructed as a quarter wave line.

Figure 4:
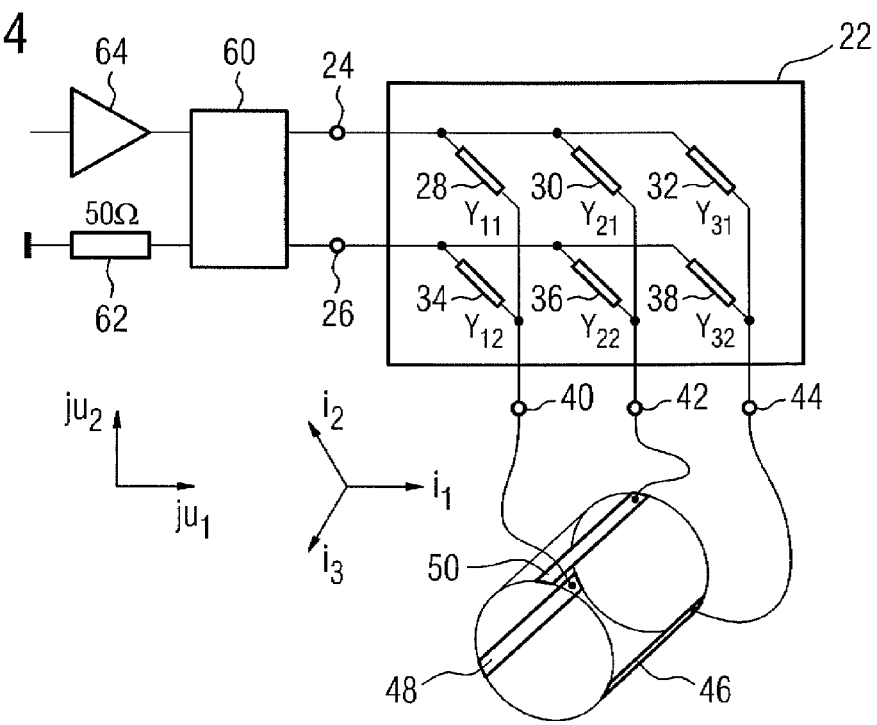
FIG. 4 shows a second embodiment of a distribution network.

FIG. 4 shows a distribution network for a circular polarization with a 90° hybrid device. The distribution network 22 is constructed as has been described above with reference to FIG. 3. The antenna elements 46, 48, 50 are arranged in a cylindrical birdcage antenna assembly. The antenna assembly may be cooled. A 90° hybrid device 60 is connected to the two inputs 24, 26. A signal, in which the voltage and the current have the same phase, is supplied into the first input 24. A signal, which is phase-shifted by 90° with respect to the signal supplied into the first input 24, is supplied into the second input 26. A transmitter 64 is connected to an input of the 90° hybrid device 60. The 90° hybrid device 60 is also terminated by an impedance 62. It is not possible to generate any desired phases between the output currents using a single branching node because the currents are either in phase (90°, −90°) or in phase opposition (270°, −90° C.) with each other. If at least two input nodes are provided with phase-shifted signals, any desired complex-valued current ratios may be depicted by overlappings.

The two inputs 24, 26 of the distribution network 22 correspond to supply ports of a conventional birdcage antenna, and the inputs 24, 26 may be conventionally supplied from a single transmitter with the aid of the 90° hybrid device 60. Six real weighting factors Y in a transfer matrix are reciprocal values of characteristic impedances Z chosen for the lines. Should a weighting factor Y be zero (e.g., an infinite characteristic impedance), this phase shifter element or this quarter wave line may be omitted. Should Y have a negative sign, a phase shift of 270° instead of 90° is used for the respective phase shifter element 28, 30, 32, 34, 36, 38. In the embodiment shown in FIG. 4, a circularly polarized MR transmission field is generated by a multimode birdcage antenna with only three individually fed-in bars. The characteristic impedances or admittances of the six lines may be derived, as follows, from the complex ratios of supply voltages (0° and 90°) and antenna currents (0°, 120°, 240°) and with a scaling of all conductances for a power adjustment of 50 Ohm at the input:

$$Y_{11} = 1/70{,}7\ 1/\Omega;$$

$$Y_{21} = Y_{31} = -1/100\ 1/\Omega;$$

$$Y_{12} = 1/70{,}7\ 1/\Omega;$$

$$Y_{22} = -1/70{,}7\ 1/\Omega;$$

$$Y_{32} = 0\ (\text{i.e., no connection}).$$

Owing to the finite output impedance of the 90° hybrid device 60, it is not possible to also keep the ratio of the two input voltages and that of a linear polarized antenna resulting therefrom fixed. A non-symmetrical loading therefore leads to an ellipticity of the magnetic field polarization. However, this is also the case with the birdcage antennae that are used, which are fed using a hybrid device that is supplied by a transmitter.

Figure 5:
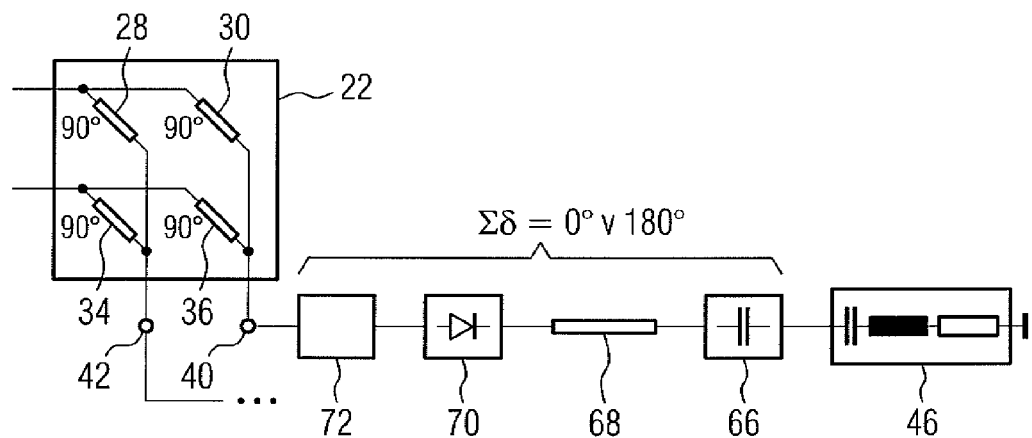
FIG. 5 shows one embodiment of a distribution network with a phase shifter.

The embodiment shown in FIG. 5 includes an additional phase shifter device in one antenna branch.

An antenna branch, which includes a phase shifter device 72, a transceiver switch 70, a feed line 68, an interface 66 and an antenna element 46, is connected to a first output 40 of the distribution network 22. The distribution network 22 is constructed as has been described above. The use of the phase shifter element or the quarter wave line in the branch between a distribution node at the input and a summation node at the antenna element may be generalized for any phase shifter devices. In practice, impedance-matching networks or transceiver switches (e.g., sub-networks), for example, may be arranged therebetween. Since each of these sub-networks may be reciprocal and almost loss-free, series connection of the sub-networks may be represented as a phase shifter with an impedance transformation. For the function according to the present embodiments, an additional phase shifter device 72 may be inserted, so the total of all phases between each output node 40, 42 of the distribution network 22 and the antenna elements regarded as a series resonant circuit is 0° or 180°.

By way of example, an antenna element 46 may be supplied as a parallel resonant circuit instead of as a series resonant circuit. In this case, a quarter wave line is formed by the phase shift of the signal (e.g., of the voltage and current (of almost 90°)). Equal currents may also be enforced by the direct parallel connection of two parallel resonant circuits. In order to also be able to add up the currents of a plurality of inputs with adjustable weighting, the phase shift of the resonant circuit wiring is reversed using a phase shifter device 72, so the parallel circuit is transformed back into a series circuit.

Figure 6:
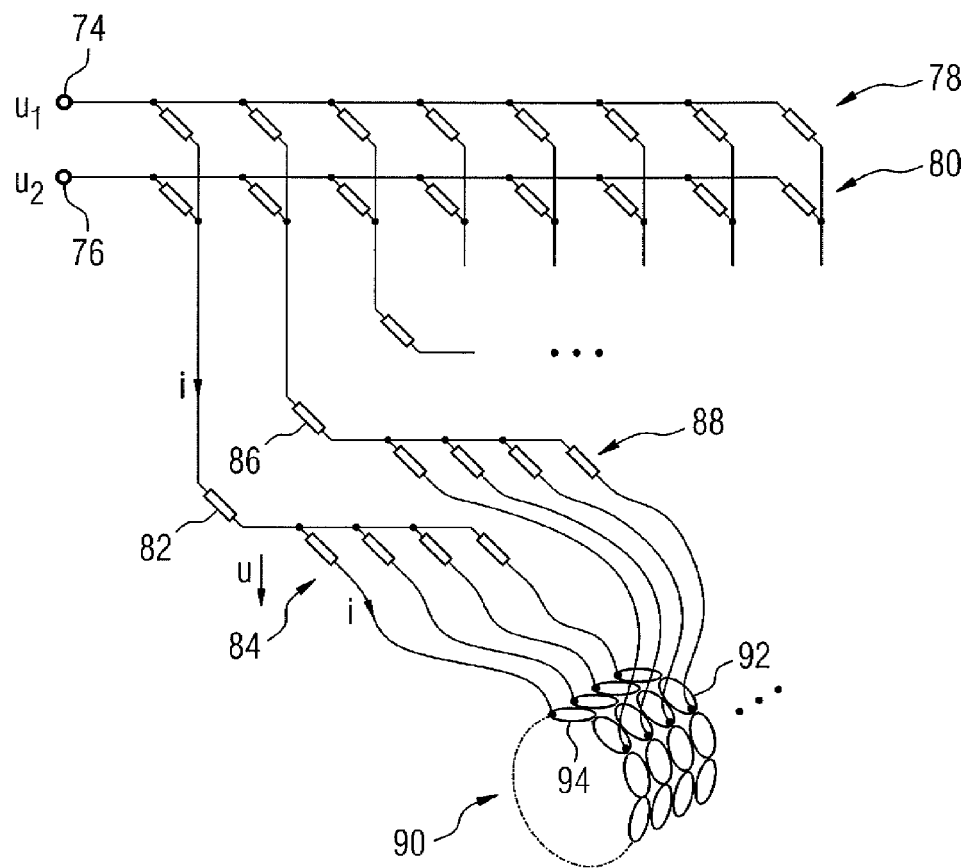
FIG. 6 shows one embodiment of a two-stage distribution network.

A two-stage distribution network for an assembly including 8×4 antenna elements is described below with reference to FIG. 6.

A first plurality of phase shifter elements 78 is connected to a first input 74. A second plurality of phase shifter elements 80 is connected to a second input 76. The desired signals for the antenna elements are produced and decoupled from each other by the first plurality of phase shifter elements 78 and the second plurality of phase shifter elements 80. A decoupled feeding-in for a plurality of antenna elements 92, 94 is produced by phase shifter elements 82, 86, which supply an antenna branch. Each antenna element of the plurality of antenna elements 92, 94 is separated by further phase shifter elements 84, 88. The antenna assembly 90 includes 8×4 antenna elements that are cylindrically arranged with the antenna elements being connected so as to be substantially parallel in the axial direction.

A large number of individual antenna elements 92, 94 are to be supplied for an expanded, two-dimensionally structured transceiver antenna assembly 90. In the case of an antenna assembly with 32 channels (e.g., staggered eightfold azimutally and fourfold in the longitudinal direction), if the conventional circularly polarized birdcage excitation is to be replicated, two distribution trees each having 32 branches are to be provided.

This high number of HF lines to be connected to a central node may lead to problems in practice. However, the distribution network may be constructed hierarchically. In a first distribution level 78, 78, the two transmission inputs are distributed among the eight peripheral rows. Two nodes each with eight lines are provided for this purpose. The eight summation nodes with a quarter wave line each are transformed back into voltage nodes.

A second level with four phase shifter elements or quarter wave branches 84, 88, which feed the four antenna elements 92, 94 of the row in phase with each other, may be connected to each of these voltage nodes. The horizontal lines shown in FIG. 6 are voltage nodes and all connected branches are connected in parallel without reciprocal phase shift. The phase shifter elements 78, 80, 82, 84, 86, 88 may be constructed as quarter wave lines with a phase shift of 90° or 270°. The lines connected to the first plurality of phase shifter elements 78 and to the second plurality of phase shifter elements 80 form current summation nodes, into which a plurality of paths may flow in phase.

A potential coupling of the currents into the antenna elements is not eliminated by the antenna circuit. Nevertheless, currents may flow into the individual antenna elements in a predefined ratio.

Figure 7:
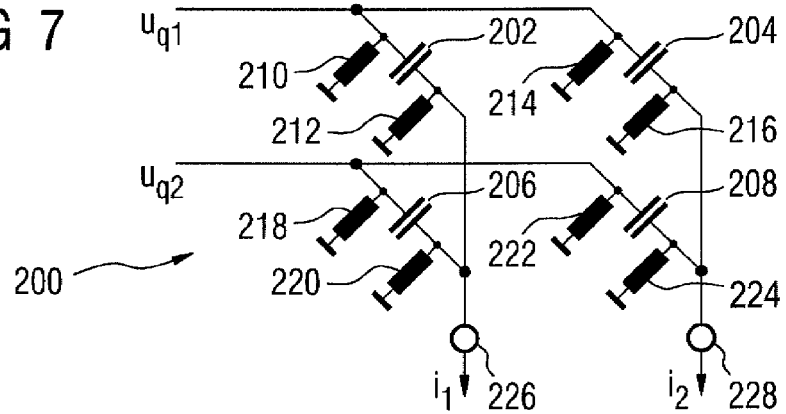
FIG. 7 shows one embodiment of a substitute circuit of phase shifter elements.

FIG. 7 shows an equivalent circuit diagram of an antenna circuit according to the present embodiments. A phase shifter element is formed by a capacitor 202. Inductors 210, 212 that are connected to ground are connected to the capacitor 202. The additional phase shifter elements are formed by capacitors 204, 206, 208 and by inductors 214, 216, 218, 220, 222, 224. The inductors 210 and 214 are connected in parallel and may be combined to form inductor 230. Inductors 218, 222 may also be combined to form inductor 232. A connector of the inductors 230 and 232 is also at a same potential as the respective input in the distribution network.

At an output side, the inductors 216 and 224 may be combined to form inductor 236, since the inductors 216 and 224 are connected in parallel. At another output, the inductors 212 and 220 connected in parallel may be combined to form inductor 234. The inductors 234 and 236 are connected to outputs or to lines that are connected to the outputs of the distribution network.

This results in a straightforward implementation of the branches including phase shifters connected as high-pass Π-elements. An assembly of M×N capacitors is provided for an M-to-N distributor. The respective weighting factor (e.g., admittance Y) is specified by the capacitor according to $Y=2\pi fC$. The shunt inductors at the input and output of each phase shifter element may be combined, so M+N inductors are provided.

In a manner similar to as is depicted in U.S. Pat. No. 7,573,036 for a PET system, the capacitors may be implemented, for example, as a two-sided printed circuit board. In this case, the conductors connected to the supply nodes run on one side and the conductors of the current summation nodes on the other side. The respective weighting factor is implemented as a coupling capacitor with adjustable area or as holes in a shielding layer located between the surfaces.

Figure 8:
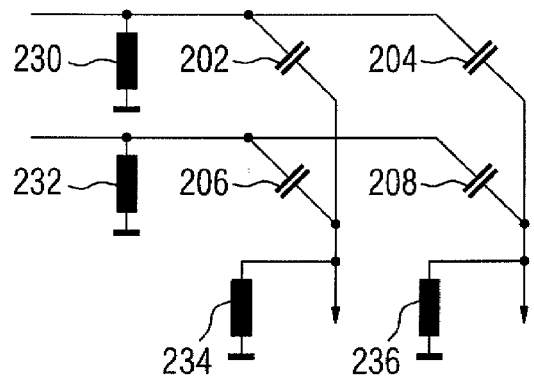
FIG. 8 shows a first embodiment of a simplified circuit.
Figure 9:
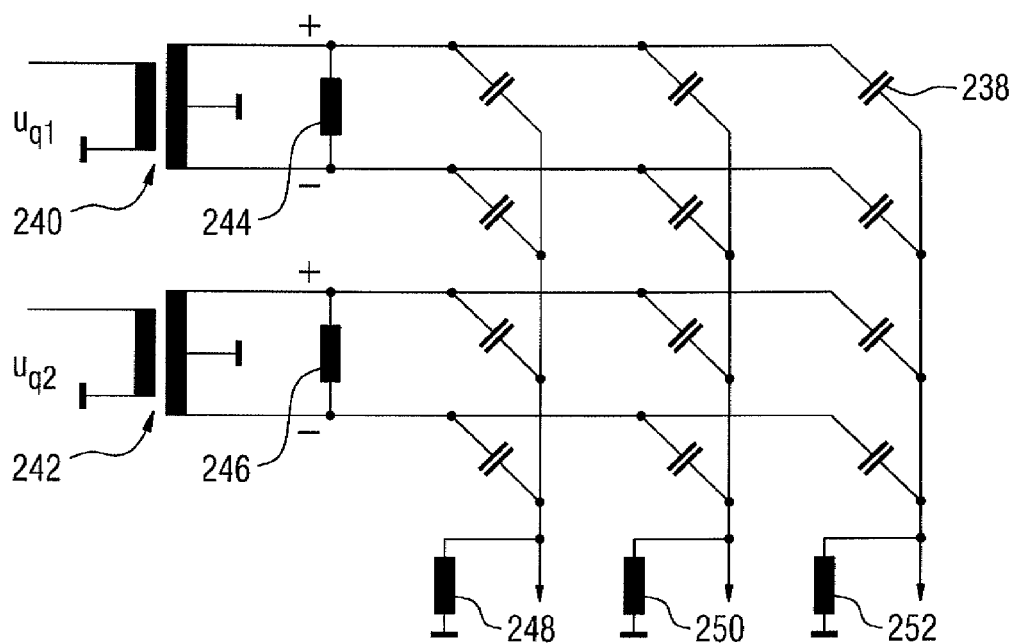
FIG. 9 shows a second embodiment of a simplified circuit.

FIG. 9 shows a distribution network, to which two baluns are connected. Using a balun 240 that is a phase shifter device with a phase shift of 180° at each input of the distribution network, signals may also be implemented in phase opposition. The circuitry of FIG. 9 substantially corresponds to that of FIG. 8, with capacitors 238 constituting the phase shifter element, inductors 244, 246 constituting the parallel circuit of the input-side inductors of the phase shifter elements, and inductors 248, 250, 252 constituting the parallel circuit of the output-side inductors of the phase shifter elements. The inductors 244, 246 are each connected to outputs of a balun 240, 242.

A distribution network with 2×M inputs and N summation nodes results. A weighting factor may be determined by a difference in the coupling capacitors connected to the inputs of a pair in phase opposition, with the weighting factor being zero in the case of two identical capacitors 238.

A known structure for signal splitting is a Butler matrix that allows two circularly polarized birdcage basic modes and all higher order modes with higher spatial frequencies to be excited.

The Butler matrix is a substantially analog Fourier transformation between N input ports and N output ports. The Butler matrix is known from Meinke Gundlach, Taschenbuch der HF-Technik. A Butler matrix corresponds to a complex-valued fast Fourier-Transformation (FFT) with basic function $e^{j\,m\phi}$, and produces complex-valued current allocations. The counterpart is a real-valued Fourier transformation, with sin (m$\phi$) or cos(m$\phi$) as the basic function. The corresponding switch matrix accordingly generates output signals with sin or cos amplitude weighting and does not produce any phases differing from 0° or 180° between the outputs.

N is the number of antenna elements in the peripheral direction (e.g., 8, 12,or 16). This is also the number of basically possible Fourier modes. M denotes the consecutive number of a rotating mode. By way of example, M=1 is the left-turning homogenous birdcage mode, and M=−1 is the right-turning homogenous birdcage mode. The higher modes have a spatially shorter periodic change in current direction, and the fields therefore penetrate into the object to a lesser extent. To reduce the number of transmitters, in practice, one subset M of the N possible modes is excited.

As an analog implementation of a complex-valued FFT, a Butler matrix with N inputs and outputs uses an outlay of N/2×1d (N) 90° hybrid devices. Inputs of the Butler matrix correspond to complex current allocations $i(\phi)\sim e^{j2\pi m\phi}$, which already generate circularly polarized fields with different azimutal and radial structure. Using the supply network according to the present embodiments, a real-valued discrete Fourier transformation may be achieved by selecting a current weight according to cos(2πm$\phi$) or sin(2πm$\phi$). To replicate a Butler matrix with N channels, N upstream 90° hybrid devices and a distribution network with 2N inputs and N outputs connected thereto is provided. The outlay that increases quadratically with N for the 2×N×N branches initially seems higher than that for the Butler matrix. This only slightly increases the outlay with just one capacitor per branch.

The drawback may be reduced if it is not necessary for all N modes to be excited and instead, just M<N transmitters are to excite a subset of N possible modes. In one embodiment, inputs for the modes that are not used may also be formed in order to short-circuit the modes that are not used. Undesirable current fractions potentially induced by a non-symmetrical load may be suppressed with higher spatial frequencies. In addition to the fixed impression of the current patterns, an additional advantage of a real-valued Fourier supply network lies in the fact that with a multi-channel supply of each mode at an input, each input may be individually adjusted to the respective transmitter.

Figure 10:
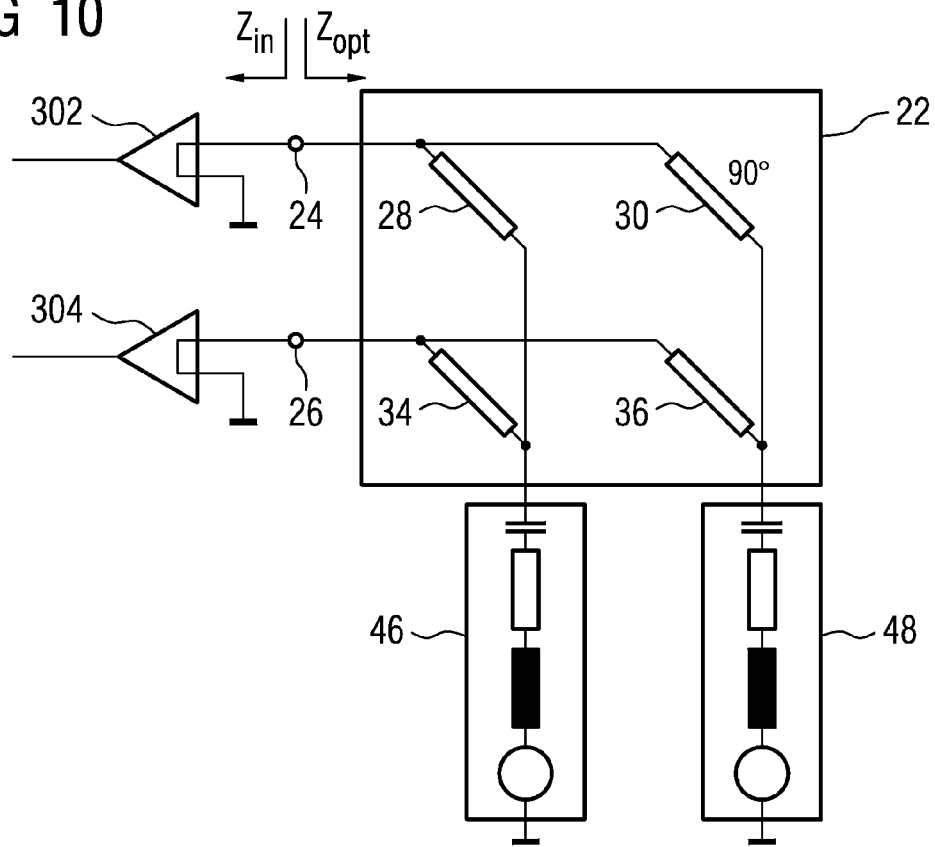
FIG. 10 shows an embodiment, in which the antenna circuit is used during receiving.
Figure 11:
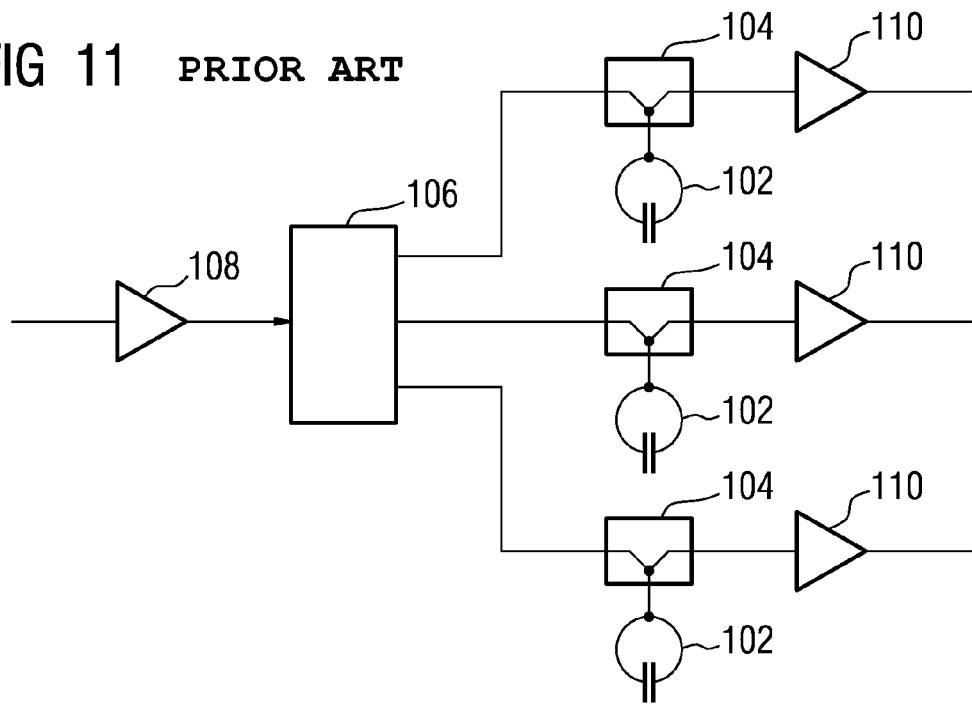
FIG. 11 shows an antenna circuit according to the prior art.

FIG. 10 shows how the antenna circuit may be used for receiving signals. FIG. 10 shows the above-described distribution network 22 and the antenna elements 46, 48. The signals received by the antenna elements 46, 48 are led by the phase shifter elements 28, 30, 34, 36 to circuit nodes 24, 26, to which one amplifier 302, 303, respectively, is connected. $Z_{in} \ll Z_{opt}$ applies. The antenna circuit according to the present embodiments with the parallel connection via phase shifter devices, which generate a phase shift of 90° or 270°, is not suitable for distributing transmitters among antenna elements 46, 48 but may also be used to form linear combinations of receiving signals. This is advantageous, for example, if signals of a larger number of antenna elements are to be processed with a smaller number of receivers. A further advantage is that the conventional preamplifier decoupling (e.g., the damping of the antenna resonance by the input impedance of the preamplifier) may continue to be used because there is the same electrical length between an output and each input connected to the output. It may be provided that with an additional phase shifter device, that the preamplifier 302, 304 for the branching nodes or circuit connectors 24, 26 constitutes a low-resistance impedance compared with signal source 46, 48.

The description of the exemplary embodiments is not to be taken as limiting with regard to a specific physical embodiment of the invention. The present embodiments may be partially or wholly implemented using software and/or hardware and/or distributed among a plurality of physical products (e.g., computer program products).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An antenna circuit that is adapted to supply, read out, or supply and read out a plurality of antenna elements of an antenna assembly of a magnetic resonance imaging system, the antenna circuit comprising:
   a first circuit connector that is adapted to be connected to a receiving, transmitting, or receiving and transmitting circuit;
   a first antenna-side connector that is adapted to be connected to a first antenna element of the antenna assembly that forms a parallel resonance circuit, and a second antenna-side connector that is adapted to be connected to a second antenna element of the antenna assembly that forms a series resonance circuit; and
   a first phase shifter element and a second phase shifter element that each cause a phase shift of a signal of 90° or 270° and each have a predetermined admittance,
   wherein a first connector of the first phase shifter element and a first connector of the second phase shifter element are connected to the first circuit connector, and
   wherein a second connector of the first phase shifter element is connected to the first antenna-side connector and a second connector of the second phase shifter element is connected to the second antenna-side connector,
   wherein a ratio of currents in the first antenna element and the second antenna element is provided by the predetermined admittances of the first phase shifter element and the second phase shifter element.

2. An antenna circuit that is adapted to supply, read out, or supply and read out a plurality of antenna elements of an antenna assembly of a magnetic resonance imaging system, the antenna circuit comprising:
   a plurality of circuit connectors comprising a first circuit connector that is adapted to be connected to a first receiving, transmitting, or receiving and transmitting circuit, and a second circuit connector that is adapted to be connected to a second receiving, transmitting, or receiving and transmitting circuit;
   a first antenna-side connector that is adapted to be connected to a first antenna element of the antenna assembly; and
   a first phase shifter element and a second phase shifter element that each cause a phase shift of a signal of 90° or 270° and each have a predetermined admittance,
   wherein a first connector of the first phase shifter element is connected to the first circuit connector, and a first connector of the second phase shifter element is connected to the second circuit connector, and
   wherein a second connector of the first phase shifter element is connected to the first antenna-side connector, and a second connector of the second phase shifter element is connected to the first antenna-side connector,
   wherein current in the first antenna element is fixed by a sum of voltages at the plurality of circuit connectors multiplied by the predetermined admittance of the respective phase shifter element.

3. The antenna circuit as claimed in claim 1, wherein the antenna assembly is radially arranged between at least one magnet, at least one gradient coil, and an object to be examined.

4. The antenna circuit as claimed in claim 1, further comprising a third phase shifter element that causes a phase shift of the signal of 90° or 270° and has a predetermined admittance,
   wherein a first connector of the third phase shifter element is connected to the first circuit connector, and a second connector of the third phase shifter element is connected to a third antenna-side connector.

5. The antenna circuit as claimed in claim 2, further comprising a third phase shifter element that causes a phase shift of the signal of 90° or 270° and has a predetermined admittance,
   wherein a first connector of the third phase shifter element is connected to the second circuit connector, and a second connector of the third phase shifter element is connected to the first antenna-side connector.

6. The antenna circuit as claimed in claim 1, further comprising:
   a plurality of circuit connectors, each circuit connector of the plurality of circuit connectors being adapted to be connected to a receiving circuit, a transmitting circuit, or a receiving and transmitting circuit, the plurality of circuit connectors comprising the first circuit connector; and
   a plurality of antenna-side connectors, each antenna-side connector of the plurality of antenna-side connectors being adapted to be connected to an antenna element of the plurality of antenna elements, the number of the plurality of antenna-side connectors being greater than the number of the plurality of circuit connectors, the plurality of antenna-side connectors comprising the first antenna-side connector and the second antenna-side connector,
   wherein each antenna-side connector of the plurality of antenna-side connectors is connected to at least one circuit connector of the plurality of circuit connectors by a phase shifter element that causes a phase shift of the signal of 90° or 270° and has a predetermined admittance.

7. The antenna circuit as claimed in claim 4, wherein at least two phase shifter elements of the first phase shifter element, the second phase shifter element, and the third phase shifter element have different admittances.

8. The antenna circuit as claimed in claim 2, wherein a first signal is connected to the first circuit connector, and a second signal is connected to the second circuit connector, and
wherein the second signal is phase-shifted by 90° with respect to the first signal.

9. The antenna circuit as claimed in claim 1, further comprising a third antenna-side connector that is adapted to be connected to a third antenna element of the antenna assembly.

10. The antenna circuit as claimed in claim 1, wherein at least the first antenna-side connector is connected to a phase shifter device that is operable to compensate any phase difference.

11. The antenna circuit as claimed in claim 4, wherein the first antenna-side connector or the second antenna-side connector is connected to at least two of the first phase shifter element, the second phase shifter element, and the third shifter element connected in series.

12. An antenna circuit that is adapted to supply, read out, or supply and read out a plurality of antenna elements of an antenna assembly of a magnetic resonance imaging system, the antenna circuit comprising:
a plurality of circuit connectors, the plurality of circuit connectors comprising a first circuit connector adapted to be connected to a receiving, transmitting, or receiving and transmitting circuit;
a plurality of antenna-side connectors, the plurality of antenna-side connectors comprising a first antenna-side connector and a second antenna-side connector, wherein the first antenna-side connector is adapted to be connected to a first antenna element of the antenna assembly that forms a parallel resonance circuit, and the second antenna-side connector is adapted to be connected to a second antenna element of the antenna assembly that forms a series resonance circuit; and
a plurality of phase shifter elements, the plurality of phase shifter elements comprising a first phase shifter element and a second phase shifter element, wherein the first phase shifter element and a second phase shifter element each cause a phase shift of a signal of 90° or 270° and each have a predetermined admittance, each phase shifter element of the plurality of phase shifter elements being connected between a circuit connector of the plurality of circuit connectors and an antenna-side connector of the plurality of antenna-side connectors, each phase shifter element of the phase shifter elements being formed by a capacitor, a first inductor being connected to each circuit connector of the plurality of circuit connectors, a second inductor being connected to each antenna-side connector of the plurality of antenna-side connectors,
wherein the inductors and the capacitors are dimensioned such that a phase shift of the signal of 90° or 270° results between the circuit connector and the antenna-side connector.

13. An antenna circuit that is adapted to supply, read out, or supply and read out a plurality of antenna elements of an antenna assembly of a magnetic resonance imaging system, the antenna circuit comprising:
a first circuit connector that is adapted to be connected to a receiving, transmitting, or receiving and transmitting circuit;
a second circuit connector;
a third circuit connector;
a fourth circuit connector;
a plurality of antenna-side connectors, the plurality of antenna-side connectors comprising a first antenna-side connector and a second antenna-side connector, wherein the first antenna-side connector is adapted to be connected to a first antenna element of the antenna assembly, and the second antenna-side connector is adapted to be connected to a second antenna element of the antenna assembly; and
a plurality of phase shifter elements, the plurality of phase shifter elements comprising a first phase shifter element and a second phase shifter element, wherein the first phase shifter element and a second phase shifter element each cause a phase shift of a signal of 90° or 270° and each have a predetermined admittance, each phase shifter element of the plurality of phase shifter elements being connected between a circuit connector of the plurality of circuit connectors and an antenna-side connector of the plurality of antenna-side connectors, each phase shifter element of the plurality of phase shifter elements being formed by a capacitor;
a first balun connected to the first circuit connector and the second circuit connector;
a second balun connected to the third circuit connector and the fourth circuit connector; and
an inductor connected to each antenna-side connector of the plurality of antenna-side connectors and the first balun,
wherein the second balun, the inductors, and the capacitors are dimensioned such that a phase shift of the signal of 90° or 270° results between a circuit connector of the first circuit connector, the second circuit connector, the third circuit connector, and the fourth circuit connector, and an antenna-side connector of the plurality of antenna-side connectors.

14. The antenna circuit as claimed in claim 2, wherein at least one circuit connector of the first circuit connector and the second circuit connector is connected to an input of an amplifier.

15. The antenna circuit as claimed in claim 2, wherein the antenna assembly is radially arranged between at least one magnet, at least one gradient coil, and an object to be examined.

16. The antenna circuit as claimed in claim 1, wherein the antenna assembly is constructed as a birdcage antenna.

17. An antenna assembly of a magnetic resonance imaging system, the antenna assembly comprising:
a plurality of antenna elements; and
an antenna circuit that is adapted to supply, read out, or supply and read out the plurality of antenna elements, the antenna circuit comprising:
a first circuit connector that is adapted to be connected to a receiving, transmitting, or receiving and transmitting circuit;
a first antenna-side connector that is adapted to be connected to a first antenna element of the antenna assembly, and a second antenna-side connector that is adapted to be connected to a second antenna element of the antenna assembly; and
a first phase shifter element and a second phase shifter element that each cause a phase shift of a signal of 90° or 270° and each have a predetermined admittance,
wherein a first connector of the first phase shifter element and a first connector of the second phase shifter element are connected to the first circuit connector, and
wherein a second connector of the first phase shifter element is connected to the first antenna-side connector, and a second connector of the second phase shifter element is connected to the second antenna-side connector, wherein the first antenna-side connector is adapted to be connected to an antenna element of the plurality of antenna elements that forms a parallel resonance circuit, and wherein the second antenna-side connector is adapted to be connected to an antenna element of the plurality of antenna elements that forms a series resonance circuit.

\* \* \* \* \*